United States Patent [19]

Hariharan et al.

[11] Patent Number: 4,970,703
[45] Date of Patent: Nov. 13, 1990

[54] SWITCHED CAPACITOR WAVEFORM PROCESSING CIRCUIT

[75] Inventors: Peruvamba R. Hariharan; Robert W. Downing, both of Fort Wayne, Ind.

[73] Assignee: Magnavox Government and Industrial Electronics Company, Fort Wayne, Ind.

[21] Appl. No.: 608,873

[22] Filed: May 10, 1984

[51] Int. Cl.$^5$ .............................................. G01S 3/80
[52] U.S. Cl. .................................. 367/138; 367/122; 364/861
[58] Field of Search ...................... 367/105, 122, 138; 364/726, 861

[56] References Cited

U.S. PATENT DOCUMENTS

| | | | |
|---|---|---|---|
| 4,207,621 | 6/1980 | Clearwaters et al. | 367/122 |
| 4,207,624 | 6/1980 | Dentino et al. | 364/726 |
| 4,274,148 | 6/1981 | van't Hullenaar | 367/122 |
| 4,354,250 | 10/1982 | Lee | 364/861 |
| 4,363,305 | 5/1983 | Lee | 364/861 |
| 4,468,749 | 8/1984 | Kato et al. | 364/861 |
| 4,510,586 | 4/1985 | Grall et al. | 367/105 |

Primary Examiner—Salvatore Cangialosi
Attorney, Agent, or Firm—Roger M. Rickert; Thomas A. Briody; Richard T. Seeger

[57] ABSTRACT

Waveform inputs are sampled to provide vector inputs which are coupled to respective ones of a plurality of series connected time delay stages in a processing circuit. Each vector is weighted, or amplified, and time delayed by each stage between its input point and the circuit output. Each stage has switched capacitors and an operational amplifier. The delay of each stage is the period of the capacitor switching frequency. All of the components in the stages and vector input circuitry are solid state switches, capacitors or operational amplifiers and therefore are especially suitable for integration in a monolithic or film substrate. The circuit is particularly adapted to beam steering a plurality of waveform inputs from an array of hydrophones.

10 Claims, 4 Drawing Sheets

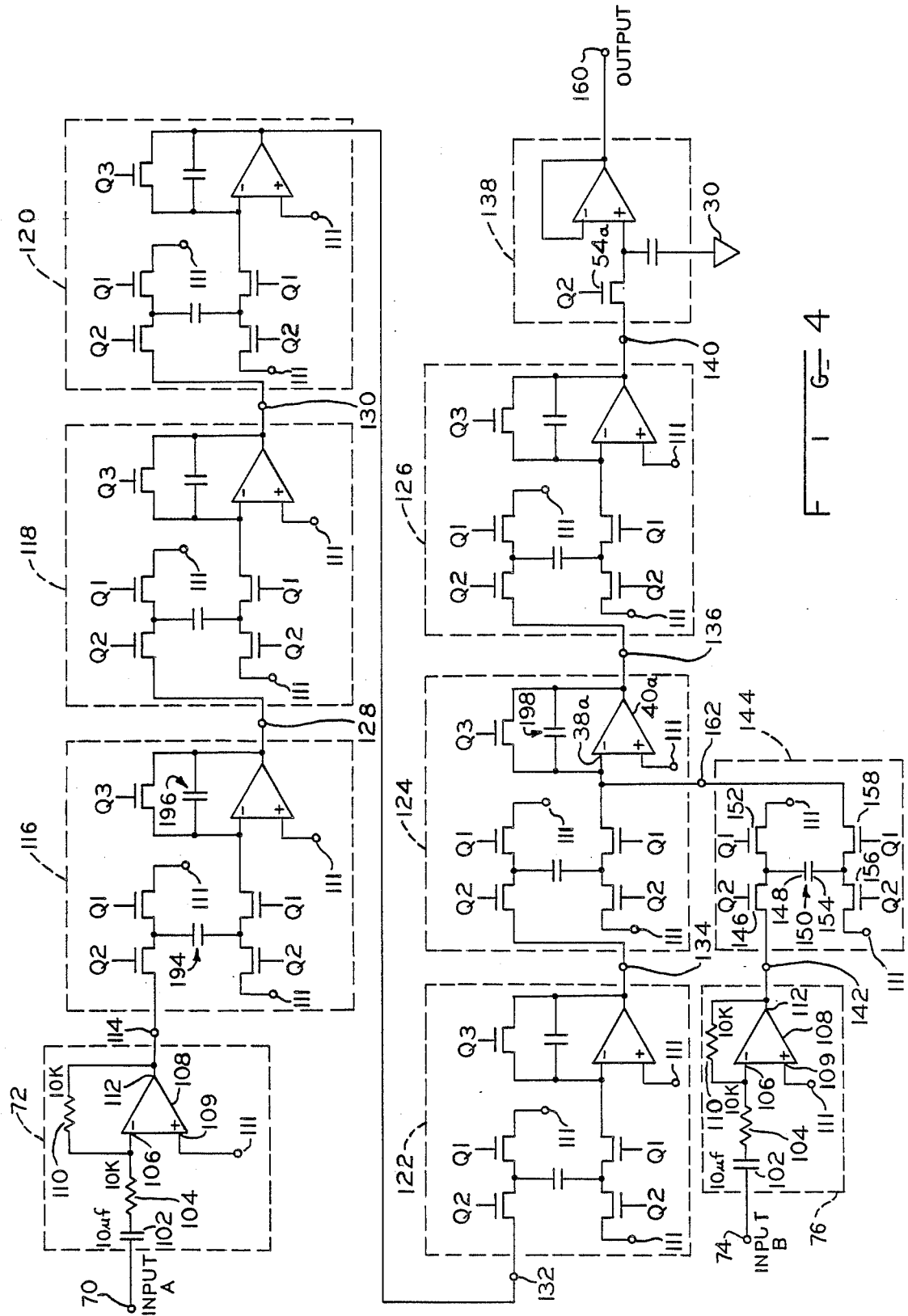

1

SWITCHED CAPACITOR WAVEFORM PROCESSING CIRCUIT

BACKGROUND OF THE INVENTION

1. Field of the Invention

This invention pertains to switched capacitor vector processing circuitry and more particularly to integrated circuit switched capacitor beam steering circuitry for an array of hydrophones.

2. Statement of Prior Art

Typically an array of hydrophones is provided with hydrophone waveform output delay and/or weighting circuitry to steer or form acoustic wave beams. Discrete circuit components not suitable for integration on a monolithic or film stratum are required in conventional circuitry. This results in relatively expensive and bulky circuitry. Efforts to cost reduce and minimize circuit size have been largely unsuccessful.

SUMMARY OF THE INVENTION

The circuitry of this invention utilizes switched capacitors and operational amplifiers which are readily integrated on monolithic or film stratum to provide vector processing or beam steering circuitry on an integrated circuit chip. Each input vector, which is a sample of the input waveform taken at the switching frequency, from a corresponding one of an array of hydrophones is delayed by one or more of series connected switched capacitor delay stages, the number of stages depending at which delay stage the input waveform is introduced. The delay of each stage depends on the switching frequency of the capacitors. Also, each input vector may be weighted by choosing corresponding capacitive values of switched capacitors. The delayed and weighted input vectors are vectorially summed and the resultant vector appears at the output of the final delay stage.

Each of the series coupled delay stages comprises a switched input capacitor having first and second plates, an operational amplifier having a negative (inverting) input, a positive (noninverting) input and an output. First and second plates of a switched feedback capacitor are connected respectively to the amplifier negative input and output. The switched input capacitor first plate at a first switching pulse is switchably discharged and then at a second switching pulse is switchably coupled to an input waveform if it is in the first stage or to an amplifier output of the previous stage if it is the second or succeeding stage. The switched input capacitor second plate at a first switching pulse is switchably coupled to the amplifier negative input and then at the second switching pulse is switchably discharged. The plates of the feedback capacitor are at a third switching pulse then switchably coupled to each other. The first plate of the first stage switched capacitor is coupled to an input waveform and additional input waveforms may be applied through respective input switched capacitors to the amplifier negative input of respective intermediate stages. Vectors of the input waveforms are time delayed in proportion to the number of delay stages between their respective input stage and the final time delay stage and in proportion to the period of the switching frequency. Also, the vectors of the input waveforms are weighted in proportion to the capacitance of their respective input switched capacitors and the capacitors of the feedback capacitor of their respective input stages to change the output vector and waveform taken at the output of a sample and hold stage coupled to the final time delay stage.

A switching circuit supplies three switching pulses, $Q_1$, $Q_2$, $Q_3$ to close first, second and third switches respectively in each of the input, time delay stages and sample and hold stages to provide the aforementioned switching. The $Q_1$, $Q_2$, $Q_3$ switching pulses are in sequence and time separated within a period T of the switching frequency $f_s$. The switches closed by pulses $Q_1$, $Q_2$ provide the time delay for each stage and pulse $Q_3$ discharges the feedback capacitor and places the output of each delay stage amplifier at AC zero providing DC stability and facilitating stage cascading.

The above mentioned and other features and objects of this invention and the manner of obtaining them will become more apparent and the invention itself will be best understood by reference to the following description of an embodiment of the invention taken in conjunction with the accompanying drawings.

BRIEF DESCRIPTION OF THE DRAWINGS

FIG. 4 is a schematic partially block diagram of the circuit of FIG. 3 having two input waveforms and six time delay stages;

DESCRIPTION OF A PREFERRED EMBODIMENT

Figure 1:
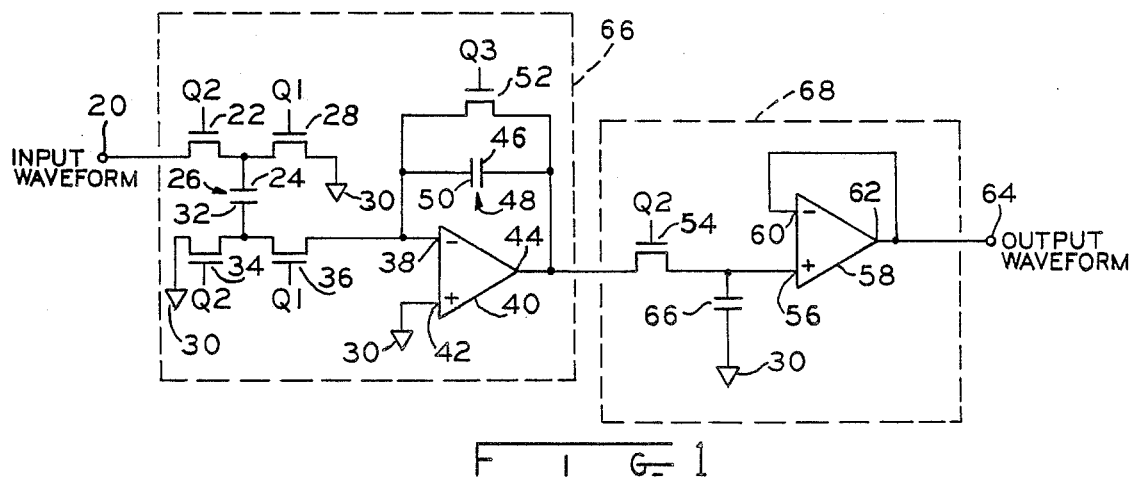
FIG. 1 is a simplified schematic partially block diagram of a circuit having one input waveform and one time delay stage.

Referring to FIG. 1 a circuit simplified for explanatory purposes will be described. An input waveform is applied to terminal 20 which is coupled through switch 22 to first plate 24 of input capacitor 26. Plate 24 is coupled through switch 28 to a discharge potential, in this case ground 30. The discharge potential may be other than ground 30 as will become apparent in the discussion of the embodiment shown in FIGS. 4–6. Second plate 32 of capacitor 26 is coupled through switch 34 to ground 30 and through switch 36 to negative (inverting) input 38 of operational amplifier 40. Positive (noninverting) input 42 of amplifier 40 is coupled to ground 30. Amplifier 40 output 44 is coupled to plate 46 of feedback capacitor 48. Plate 50 of capacitor 48 is coupled to negative input 38. Switch 52 is coupled across plates 48, 50. Switch 54 is coupled between amplifier output 44 and positive input 56 of sample and hold operational amplifier 58. Negative input 60 is coupled to output 62 of amplifier 58 which is coupled to waveform output 64. Capacitor 66 is coupled between positive input 56 and ground 30. Switches 22, 28, 34, 36, 52 and 54 are conventional solid state switches.

Figure 2:
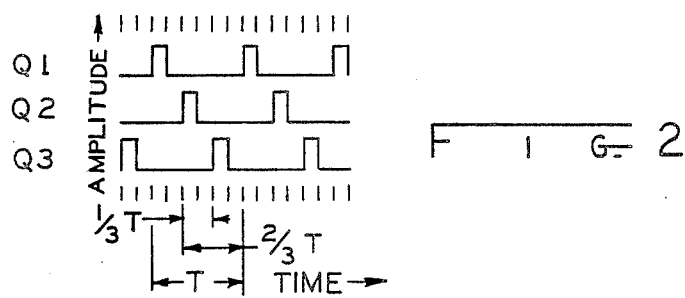
FIG. 2 is a graph with amplitude scaled on the y axis and time scaled on the x axis of the timing pulses $Q_1$, $Q_2$, $Q_3$ for operating the switches in the diagram of FIG. 1.

Switches 28, 36 are closed by switching pulses Q$_1$, FIG. 2, supplied by a conventional clock generator, not shown in FIG. 1, at a pulse rate frequency f$_s$ which in this embodiment is 6.2 KHz. The pulses Q$_1$ are shown in waveform Q$_1$, FIG. 2. Other pulse rate frequencies may be used and it is preferable that the pulse rate frequency be substantially higher, in one example in the order of sixty, of the input waveform frequency applied to terminal 20. Switches 22, 34, 54 are closed by switching pulses Q$_2$ and switch 52 is closed by switching pulses Q$_3$. The pulse rate frequency of Q$_2$, Q$_3$ is also f$_s$. In this embodiment the Q$_2$ pulses are ($\frac{2}{3}$)T, where T is the period of frequency f$_s$, earlier than pulses Q$_1$ and the Q$_3$ pulses are ($\frac{1}{3}$)T later than the Q$_2$ pulses.

In the operation of the FIG. 1 embodiment, a Q$_2$ pulse closes switches 22, 34 and a sample "n" of the input waveform at terminal 20 is taken across capacitor 26 where it is held. ($\frac{1}{3}$)T later a Q$_3$ pulse closes switch 52 setting amplifier output 44 to zero. ($\frac{1}{3}$)T later a pulse Q$_1$ closes switches 28, 36 and the sample "n" held on capacitor 26 for ($\frac{2}{3}$)T appears at output 44 of amplifier 40 and is held on capacitor 46 until ($\frac{1}{3}$)T later when the next Q$_2$ pulse closes switch 54 and the sample "n" appears at output 62 of sample and hold amplifier 64 and at the same time closes switches 22, 34 where a sample "n+1" of the input wave form at terminal 20 is taken. Sample "n" is time delayed by a period T between terminals 20 and 64. Sample "n+1", and succeeding samples, are likewise time delayed by a period T.

Each sample may be "weighted" by changing the ratio of the capacitances of input capacitor 26 to feedback capacitor 46, which is of advantage especially in a circuit having two or more input waveforms.

The circuitry in dashed line block 66 is a time delay stage and the circuitry in dashed block 68 is a sample and hold stage. Discharging feedback capacitor 46 provides DC stability and facilitates many delay stages to be cascaded in series.

Figure 3:
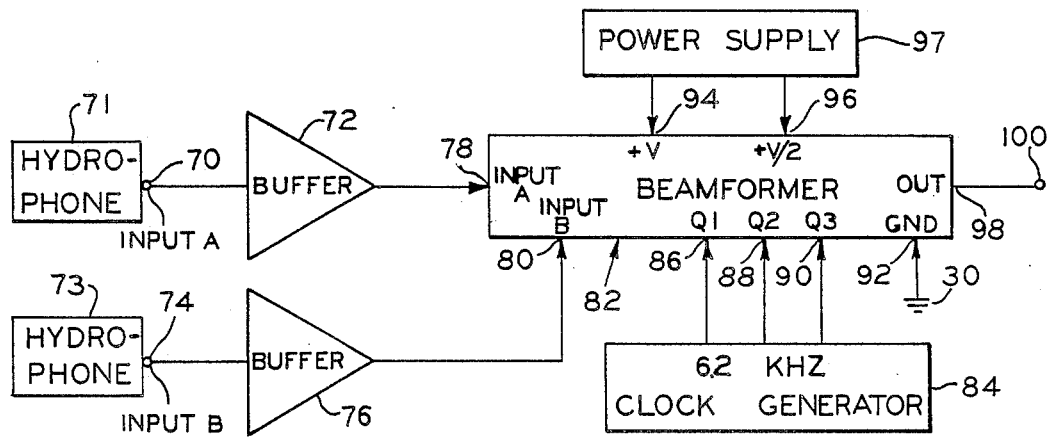
FIG. 3 is a block diagram of a circuit having an integrated circuit for beam forming.

Referring to FIG. 3 an embodiment is shown having two input waveforms designated "Input A" and "Input B" respectively. Input A as from hydrophone 71 is applied to terminal 70 which is coupled to the input of a buffer circuit 72 and Input B as from hydrophone 73 is applied to input terminal 74 of buffer circuit 76. Hydrophones 71, 73 are in a hydrophone array. The outputs of circuits 72, 76 are coupled to Input A pin 78 and Input B pin 80 respectively of integrated circuit chip 82, which has six delay stages, an input circuit and a sample and hold stage. A 6.2 KHz clock generator circuit 84 supplies Q$_1$, Q$_2$, Q$_3$ timing pulses to pins 86, 88, 90 respectively. Ground 30 is coupled to pin 92. A supply voltage +V of +15 VDC is applied to pin 94 and +V/2 or $\frac{1}{2}$ supply voltage of +7.5 VDC is applied to pin 96 from power supply 97. The output waveform at pin 98 is coupled to terminal 100. The level of supply voltage depends on the particular operational amplifier used and the output level desired.

Referring to FIG. 4, buffers 72, 76 are shown in conventional schematic form. Buffers 72, 76 each have a capacitor 102 in series with a resistor 104 coupled to negative input 106 of operational amplifier 108. The positive input 109 of amplifier 108 is coupled to terminal 111 which is coupled to a discharge voltage of +V/2 or $\frac{1}{2}$ supply voltage. The component values in a preferred embodiment are shown adjacent the respective component shown in FIG. 4. Time delay stages 116, 118, 120, 122, 124 and 126, each shown in dashed line blocks, are coupled in serially cascaded stages at terminals 128, 130, 132, 134, 136 respectively. Each time delay stage 116–126 is similar in construction and operation to stage 66, FIG. 1, with the exception that each ground 30 has been replaced by a terminal 111 which is coupled to a discharge voltage of +V/2 or $\frac{1}{2}$ supply voltage. Sample and hold stage 138, also shown in dashed lines, is similar in construction and function to stage 68, FIG. 1, and is coupled to the last time delay stage 126 at terminal 140 and results in a cleaner output waveform. The output waveform is taken at terminal 160.

Input waveform A is applied to terminal 70 which is coupled to buffer 72. Bufferred input waveform A is applied to input terminal 114 of the first time delay stage 116. Input waveform B is applied to terminal 74 which is coupled to buffer 76. Bufferred input waveform B is applied to input terminal 142 of the fifth time delay stage 144. Terminal 142 is coupled through switch 146 to first plate 148 of input capacitor 150. Plate 148 is coupled through switch 152 to terminal 111 to which is supplied a discharge potential. Second plate 154 of capacitor 150 is coupled through switch 34 to terminal 111 and through switch 158 to terminal 162 and then to negative (inverting) input 38a of operational amplifier 40a. The remaining components and connections are similar to those for delay stage 66, FIG. 1. The circuitry in input stage 144 is identical to the circuitry in time delay stage 124 that is between terminals 134 and 162 and therefore input waveform B is delayed by a period T between terminals 142 and 136. Delay stages 116–126, input stage 144, and sample and hold circuit 138 are integrated in circuit 82, FIG. 3. Operational amplifiers 108, 176 and in stages 116–126 and 138, may be of a type manufactured by Texas Instruments Incorporated, model no. TL 074. All switches may be of a type manufactured by RCA Corporation, model no. 4016.

Figures 5, 6:
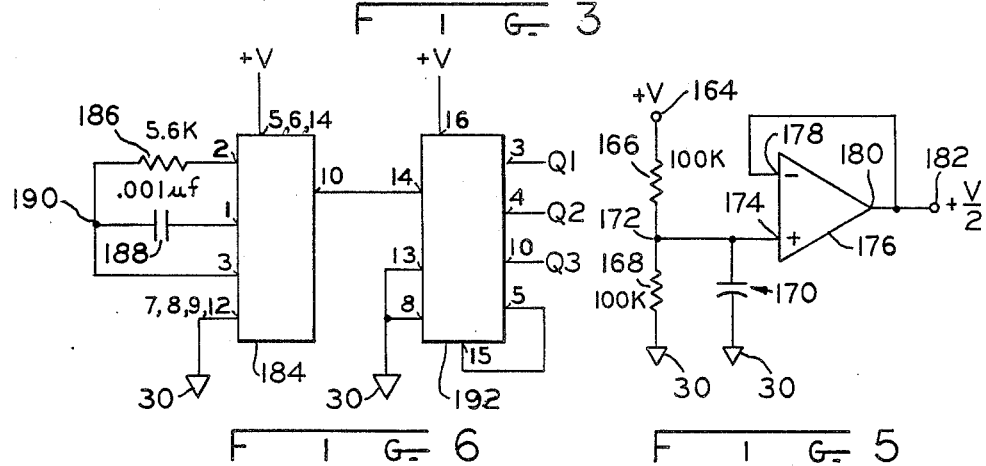
FIG. 5 is a schematic partially block diagram of a discharge voltage circuit supply for the circuit of FIG. 3.
FIG. 6 is a schematic partially block diagram of the switching signal clock circuit for the circuit of FIG. 3.

FIG. 5 is a diagram for supplying +V/2, or $\frac{1}{2}$ supply voltage +V, to each terminal 111. Supply voltage +V, which is +15 VDC in this example, is applied to terminal 164 and across voltage divider resistors 166, 168 to ground 30. One plate of capacitor 170 is coupled to junction 172 between resistors 166, 168 and to positive input 174 of operational amplifier 176. The other plate of capacitor 170 is coupled to ground 30. The input 178 of amplifier 176 is coupled to amplifier output 180 and terminal 182 which is coupled to each terminal 111. The component values are shown adjacent to their respective components in FIG. 5.

The clock generator for producing pulses Q$_1$, Q$_2$, Q$_3$ is shown in FIG. 6. Integrated circuit board 184, manufactured by RCA Corporation and having part number 4047, has pins 5, 6, 14 connected to supply voltage +V. Resistor 186 and capacitor 188 are connected between pins 2 and 1. Pin 3 is connected to junction 190 between resistor 186 and capacitor 188. Pins 7, 8, 9, 12 are coupled to ground 30. Pin 10 is coupled to pin 14 of board 192, manufactured by RCA Corporation and having part number 4017. Board 192 has pins 8, 13 coupled to ground 30, pin 16 coupled to supply voltage +V, pins 5, 15 coupled to one another, and provides Q$_1$, Q$_2$, Q$_3$ pulses at pins 3, 4 and 10 respectively.

In the operation of the circuit of FIG. 4 Input A waveform is sampled at frequency f$_s$ with each sample delayed a period T by each delay stage 116–126 for a total delay of 6T and Input B waveform is sampled at f$_s$, each sample delayed a period T by input circuit 144 together with a portion of stage 124 and by stage 126 for a total delay of 2T. Switch 54a in sample and hold stage 138 is used to provide a ($\frac{1}{3}$)T delay to the waveform sample from delay stage 126. The delay of each sample proportionally changes its phase prior to it being vectorially summed with the samples of the other input waveforms to form a resultant sample and waveform at output 160. Also, as mentioned, each input waveform sample may be weighted, or amplified, by proper selection of the ratio of the capacitances of the corresponding input capacitor to the feedback capacitor at the delay stage of the input waveform. For Input A waveform that ratio is that of capacitor 194 to capacitor 196 and for input B waveform the ratio is that of capacitor 150 to capacitor 198. All of the capacitors in delay stages 116–126, input stage 144 and sample and hold stage 138 are nonpolarized and these capacitors will referred to herein as "switched capacitors".

Figure 7:
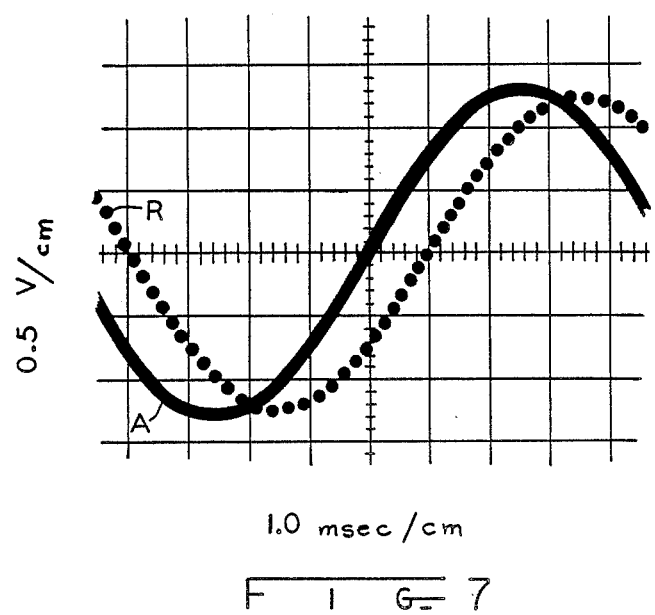
FIGS. 7–10 are observed waveforms for various input waveform and weighting combinations using the circuits of FIGS. 4–6.
Figure 8:
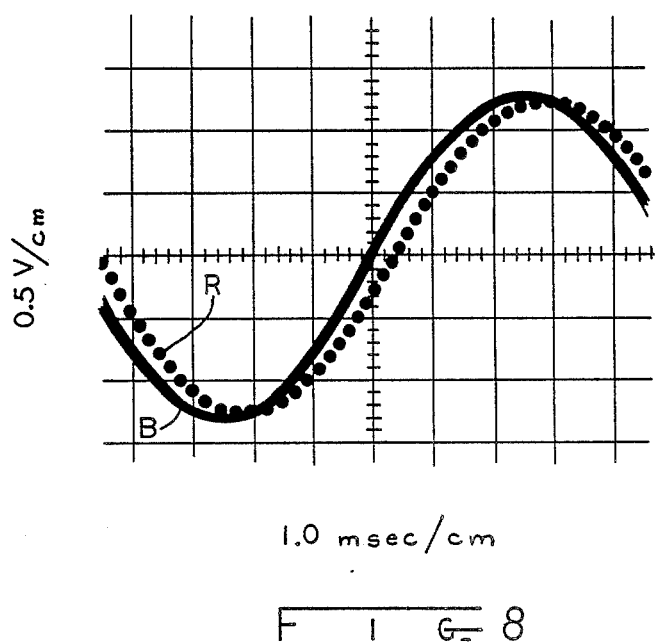
Figure 9:
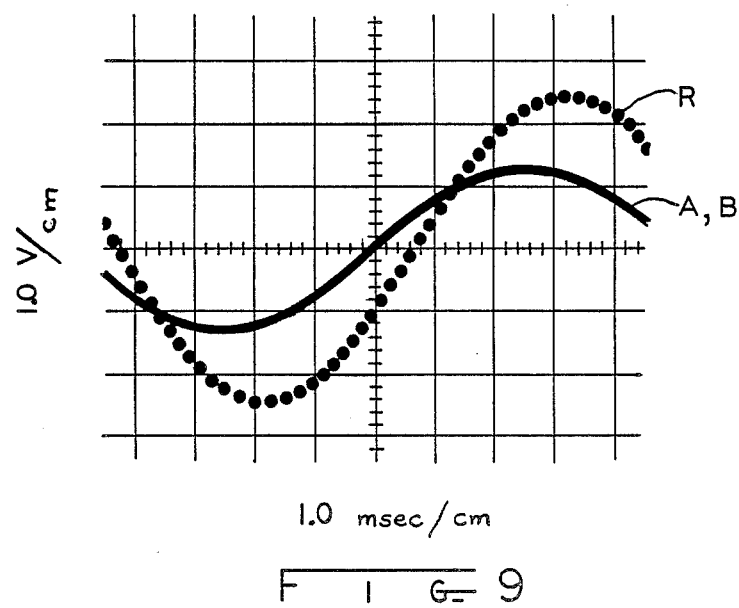

Referring to FIG. 7 a graph of an input waveform and a resultant or output waveform using the circuit of FIG. 4 is shown, with amplitude measured on the y axis (0.5 V/cm) and time measured on the x axis (1.0 ms/cm). In the graphs of FIGS. 7–10 the grid lines are assumed to be 1 cm apart. A 100 Hz input A waveform is applied to terminal 114 and output waveform R is taken at terminal 160. The sampling frequency $f_s$ is 6.2 KHz. No input is applied to terminal 142. The dotted nature of waveform R is due to the sample period. All switched capacitors are 200 pf. The theoretical gain of the waveform R is "1" since the ratio of capacitances of capacitors 194, 196 is "1". The delay of waveform A is 0.96 ms. The delay is computed as follows:

Number of stages=6
Delay per stage=T=$1/f_s$=1/6.2 KHz=0.16 ms
Total Delay=(Number of stages)(Delay per stage)
Total Delay=6×0.16 ms=0.96 ms Referring to FIG. 8 a graph similar to that of FIG. 7 is shown having an input waveform and a resultant or output waveform using the circuit of FIG. 4 with amplitude measured on the y axis (0.5 V/cm) and time measured on the x axis (1.0 ms/cm). A 100 Hz input B waveform is applied to terminal 142 and output waveform R is taken at terminal 160. The sampling frequency $f_s$ is 6.2 KHz. No input is applied to terminal 114. All switched capacitors are 200 pf. The theoretical gain of the waveform R is "1" since the ratio of capacitances of capacitors 150, 198 is "1". The delay of waveform B is 0.32 ms. The delay is computed as follows:

Number of stages=2
Delay per stage=T=$1/f_s$=1/6.2 KHz=0.16 ms
Total Delay=(Number of stages)(Delay per stage)
Total Delay=2×0.16 ms=0.32 ms Referring to FIG. 9 a graph similar to that for FIG. 7 is shown except Input A waveform is applied to terminal 114 and Input B waveform is applied to terminal 142. Since two waveforms are being processed, the phase shift of each sample of each waveform at the output is computed and vectorially added to obtain the resultant waveform. Amplitude is measured on the y axis (1.0 V/cm) and time measured on the x axis (1.0 ms/cm). The number of degrees that Input A waveform is delayed is determined as follows:

Input A has a frequency $f_a$ of 100 Hz and therefore has a period $T_a=1/f_a=1/100=0.01$ s.

Input A has a total delay of 0.96 ms, as determined above.

[(Total delay)/$T_a$]×360°/cycle=(0.96 ms/0.01 s)×360°=34 6°.

In like manner the number of degrees of each sample of Input B waveform is delayed is determined as follows:

Input B has a frequency $f_b$ of 100 Hz and therefore has a period $T_b=1/f_b=1/100=0.01$ s.

Input B has a total delay of 0.32 ms, as determined above.

[(Total delay)/$T_b$]×360°/cycle=0.32 ms/0.01 s×360°=11 5°.

Each sample of each Input A and Input B has a gain of "1" as explained above. Using these gains the amplitude of each Input A waveform sample polar vector is "1" and the amplitude of each Input B waveform sample polar vector is also "1" and knowing the delay of each sample in degrees the polar vectors of each sample can be resolved into coordinate vector components and added vectorially as follows:

Input A vector=1.0/34.6°=0.82+j0.57

$$\text{Input } B \text{ vector} = 1.0/11.5° = \frac{0.98 + j0.20}{1.80 + j0.77}$$

The resultant waveform R vector having vectorial coordinate components of 1.80+j0.77 is equivalent to a polar vector having an amplitude of 1.96 at 23.2°. The time delay for a phase delay of 23.2° is computed as follows:

Waveform R has a frequency of 100 Hz and therefore has a period $T_r=1/100=0.01$ s.

[Phase delay/(360°/cycle)]×$T_r$=(23.2°/360°)×0.01 s=0.64 ms.

Therefore waveform R has an amplitude or gain of 1.96 and is delayed 0.64 ms.

Figure 10:
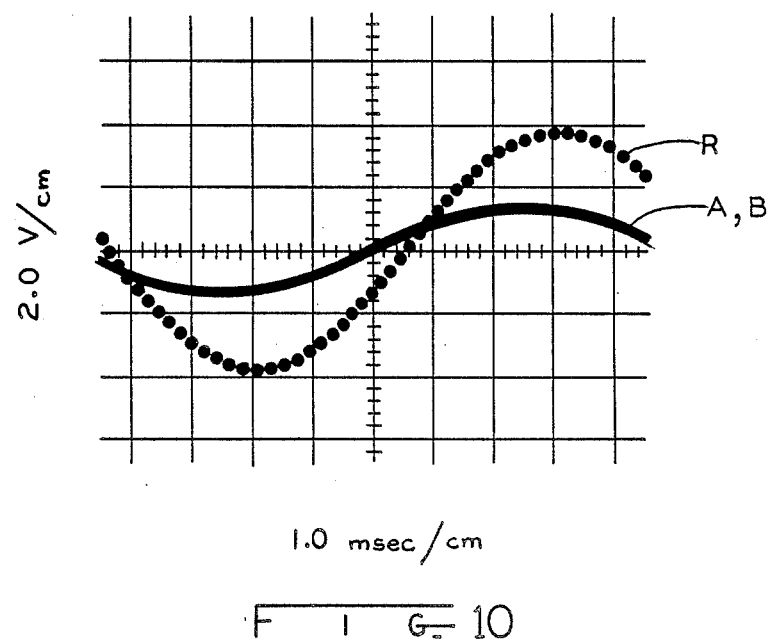

Referring to FIG. 10 a graph similar to that for FIG. 9 is shown except that Input B waveform has a gain of "2", while the gain of Input A waveform remains at a gain of "1". Amplitude is measured on the y axis (2.0 V/cm) and time measured on the x axis (1.0 ms/cm). The gain of "2" for Input B waveform is obtained by making capacitor 150 capacitance 400pf which makes the ratio of capacitances of capacitor 150 to capacitor 198 "2", since capacitor 198 remains at 200 pf. The number of degrees that Input A waveform is delayed is determined as before as follows:

Input A has a frequency $f_a$ of 100 Hz and therefore has a period $T_a=1/f_a=1/100=0.01$ s.

Input A has a total delay of 0.96 ms, as determined above.

[(Total delay)/$T_a$]×360°/cycle=(0.96 ms/0.01 s)×360°=34.6°.

In like manner the number of degrees of each sample of Input B waveform is delayed is determined as before as follows:

Input B has a frequency $f_b$ of 100 Hz and therefore has a period $T_b=1/f_b=1/100=0.01$ s.

Input B has a total delay of 0.32 ms, as determined above.

[(Total delay)/$T_b$]×360°/cycle=0.32 ms/0.01 s ×360°=11.5°.

Each sample of Input A has a gain of "1" but each sample of Input B waveform has a gain of "2" as explained above. Using these gains the amplitude of each Input A waveform sample polar vector is "1" and the amplitude of each Input B waveform sample polar vector is "2" and knowing the delay of each sample in degrees the polar vectors of each sample are known and can be resolved into coordinate vector components and added vectorially as follows:

Input A vector=1.0/34.6°=0.82+j0.57

$$\text{Input } B \text{ vector} = 2.0/11.5° = \frac{1.96 + j0.40}{2.78 + j0.97}$$

The resultant waveform R vector having vectorial coordinate components of 2.78+j0.97 is equivalent to a polar vector having an amplitude of 2.94 at 19.2°. The time delay for a phase delay of 19.2° is computed as follows:

Waveform R has a frequency of 100 Hz and therefore has a period $T_r = 1/100 = 0.01$ s.

[Phase delay/(360°/cycle)]×$T_r$=(19.2°/360°)×0.01 s=0.53 ms.

Therefore waveform R has an amplitude or gain of 2.94 and is delayed 0.53 ms.

At any stage in the series connected delay stages 116–126 the partial sum of the vectors at that stage can be weighted by making the ratio of the capacitance of the input capacitor of that stage to the capacitance of the feedback capacitor of that stage as desired.

When this invention is utilized to beam form or steer the inputs from an array of hydrophones, typically a hydrophone input is entered at each time delay stage in the manner that Input B waveform is entered at stage 124. Each hydrophone input waveform would have a respective input circuit 144. If the spacing between adjacent hydrophones in the array is d, c is the velocity of sound in water, $\beta$=angle of the steered beam at output 160 and each stage delay T, which is the period of the switching frequency $f_s$, then the following relation is obtained:

$$T = (d \sin\beta)/c.$$

Although the operation of the this invention has been described using a time delay circuit or beam former having two inputs it should be understood that any desired number of inputs can be provided within the teaching of this invention. As an example where this invention is used to provide beam steering of a hydrophone array, the number of inputs for delay processing will typically be at least equal to one number less than the number of hydrophones in the array. It should also be understood that the equivalents of the various discrete switched operational amplifiers, integrated circuits and other circuit components which have been referenced above may be combined in accordance with this invention on a single or integrated monolithic circuit device if so desired.

While there have been described above the principles of this invention in connection with specific embodiments, it is to be understood that this is by way of example and is not limiting of the scope of this invention.

WHAT IS CLAIMED IS:

1. A switched capacitor waveform processing circuit for processing an input waveform comprising:
   a first switched input capacitor having first and second plates;
   a discharge circuit means for providing capacitor plate discharge;
   a first operational amplifier having a negative input, positive input and an output, said positive input being coupled to said discharge circuit means;
   a first feedback capacitor having first and second plates coupled respectively to said amplifier negative input and output;
   first switch means for coupling when closed and uncoupling when open said switched capacitor first plate to said discharge circuit means and for coupling when closed and uncoupling when open said switched capacitor second plate to said amplifier negative input;
   second switch means for coupling when closed and uncoupling when open said switched capacitor first plate to a first input waveform to obtain a waveform sample and for coupling when closed and uncoupling when open said switched capacitor second plate to said discharge circuit means;
   switching circuit means for momentary closing at a switching frequency of $f_s$ of said first and second switch means, and for closing said first switch means in time spaced sequence during each period T of said $f_s$ from the closing of said second switch means;
   the ratio of the capacitance of said switched input capacitor to the capacitance of said feedback capacitor providing a predetermined weighting of said sample; said period T providing a predetermined time delay to said sample to obtain a predetermined waveform output at said amplifier output.

2. The apparatus of claim 1 including third switch means for switch coupling when closed and uncoupling when open said feedback capacitor first and second plates to thereby provide a switchable electrical coupling therebetween;
   said switching circuit means for momentary closing of said third switch means at said switch frequency $f_s$ during each period T of said $f_s$ in time spaced sequence after the closing of said second switch means.

3. The apparatus of claim 2 including a second switched input capacitor having first and second plates;
   a second operational amplifier having a negative input, positive input and an output, said positive input being coupled to said discharge circuit means;
   a second feedback capacitor having first and second plates coupled respectively to said second amplifier negative input and output;
   said first switch means for coupling when closed and uncoupling when open said second switched capacitor first plate to said discharge circuit means and for switching said second switched capacitor second plate to said second amplifier negative input;
   said second switch means for coupling when closed and uncoupling when open said second switched capacitor first plate to said first amplifier output and for coupling when closed and uncoupling when open said second switched capacitor second plate to said discharge circuit means;
   said third switch means for coupling when closed and uncoupling when open said second feedback capacitor first and second plates.

4. The apparatus of claim 3 including a third switched input capacitor having first and second plates;
   said first switch means is for coupling when closed and uncoupling when open said third switched capacitor first plate to said discharge means and for coupling when closed and uncoupling when open said third switched capacitor second plate to said second amplifier negative input;
   said second switch means is for coupling when closed and uncoupling when open a second input waveform to said third switched capacitor first plate and for coupling when closed and uncoupling when open said third switched capacitor second plate to said discharge circuit means.

5. The apparatus of claim 1 wherein said first switched capacitor, said first operational amplifier and said first feedback capacitor form a time delay stage;
a plurality of said time delay stages coupled serially to form a series of said stages having a first time delay stage and a last time delay stage;
said second switching means for coupling when closed and uncoupling when open the amplifier output of said each stage prior to said last stage to the switched input capacitor first plate of the next succeeding stage.

6. The apparatus of claim 5 including a plurality of said third switched input capacitors each having first and second plates;
said first switch means is for coupling when closed and uncoupling when open each of said third switched capacitor first plates to said discharge means and for coupling when closed and uncoupling when open each of said plurality of third switched capacitors second plate to said amplifier negative input of a respective time delay stage;
said second switch means is for coupling when closed and uncoupling when open a respective waveform input to each of said plurality of third switched capacitor first plates and for coupling when closed and uncoupling when open each of said plurality of third switched capacitor second plates to said discharge circuit means.

7. The apparatus of claim 5 including a sample and hold stage having an operational amplifier having a negative input, positive input and an output, said sample and hold stage output being coupled to said sample and hold stage input;
said second switch means for coupling when closed the output of said last time delay stage to said positive input of said sample and hold stage operational amplifier;
capacitor means for capacitively coupling said sample and hold stage operational amplifier positive input to said discharge circuit means.

8. The apparatus of claim 1, 2, 3, 4, 5, 6 or 11 including means for integrating the said apparatus in a monolithic or film stratum.

9. The apparatus of claim 8 including a hydrophone array, said first and second input waveforms being input waveforms from respective hydrophones in said array.

10. The apparatus of claim 9 wherein the spacing of adjacent hydrophones in said array is d, the velocity of sound in water is c, the angle of a steered beam at said last stage output is $\beta$, and the delay of each said stage is T the period of $f_s$ so that $T = (d \sin\beta)/c$.

* * * * *